US009852037B2

(12) United States Patent
Klazynski et al.

(10) Patent No.: US 9,852,037 B2
(45) Date of Patent: *Dec. 26, 2017

(54) EFFICIENCY OF CYCLE-REPRODUCIBLE DEBUG PROCESSES IN A MULTI-CORE ENVIRONMENT

(71) Applicant: International Business Machines Corporation, Armonk, NY (US)

(72) Inventors: James N. Klazynski, Austin, TX (US); Amir Nahir, Megadin (IL)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/388,499

(22) Filed: Dec. 22, 2016

(65) Prior Publication Data

US 2017/0103008 A1    Apr. 13, 2017

Related U.S. Application Data

(63) Continuation of application No. 15/013,731, filed on Feb. 2, 2016, now Pat. No. 9,513,985, which is a
(Continued)

(51) Int. Cl.
*G06F 11/22* (2006.01)
*G06F 11/263* (2006.01)
(Continued)

(52) U.S. Cl.
CPC ...... *G06F 11/2242* (2013.01); *G01R 31/3177* (2013.01); *G01R 31/31703* (2013.01); *G01R 31/31705* (2013.01); *G06F 11/2635* (2013.01)

(58) Field of Classification Search
None
See application file for complete search history.

(56) References Cited

U.S. PATENT DOCUMENTS 6,253,344 B1 * 6/2001 Fin ............... G06F 11/2236
714/738
8,522,079 B2   8/2013 Liao et al.
(Continued)

FOREIGN PATENT DOCUMENTS

CN    100565472 C    12/2009
EP    2141597 A1    1/2010
(Continued)

OTHER PUBLICATIONS

Adir et al., "Threadmill: A Post-Silicon Exerciser for Multi-Threaded Processors", DAC'11, Jun. 5-10, 2011, Copyright 2011 ACM, 46.4, pp. 860-865.
(Continued)

*Primary Examiner* — Yolanda L Wilson
(74) *Attorney, Agent, or Firm* — Maeve Carpenter

(57) ABSTRACT

An approach for improving efficiency of cycle-reproducible debug in a multi-core environment is provided. The approach executes an exerciser image on one or more cores, wherein the exerciser image includes one or more different seeds. The approach determines a seed from the one or more different seeds that locates a fail-condition. Responsive to determining a seed from the one or more different seeds that locates the fail condition, the approach determines an upper bound and a lower bound of the fail-condition. The approach determines an exact cycle where the fail-condition occurs. The approach constructs a multi-cycle trace for the fail-condition.

1 Claim, 3 Drawing Sheets

Related U.S. Application Data continuation of application No. 14/753,324, filed on Jun. 29, 2015, now Pat. No. 9,626,265.

(51) Int. Cl.
*G01R 31/317* (2006.01)
*G01R 31/3177* (2006.01)

(56) References Cited

U.S. PATENT DOCUMENTS

| | | | |
|---|---|---|---|
| 8,595,554 B2 | 11/2013 | Bellofatto et al. | |
| 9,513,985 B1 | 12/2016 | Klazynski et al. | |
| 2007/0168651 A1 | 7/2007 | John | |
| 2009/0006894 A1 | 1/2009 | Bellofatto et al. | |
| 2009/0083600 A1 | 3/2009 | Rahman et al. | |
| 2011/0087922 A1* | 4/2011 | Lee | G06F 11/2242 714/26 |
| 2011/0119521 A1* | 5/2011 | Bellofatto | G06F 1/10 713/503 |
| 2012/0096314 A1* | 4/2012 | Motika | G06F 11/27 714/30 |
| 2012/0117413 A1* | 5/2012 | Asaad | G06F 1/06 713/501 |
| 2012/0166882 A1* | 6/2012 | Bhattacharyya | G06F 11/2242 714/37 |
| 2012/0210103 A1 | 8/2012 | Liao et al. | |
| 2013/0173964 A1* | 7/2013 | Okano | G06F 11/2294 714/33 |
| 2013/0238933 A1 | 9/2013 | Shin | |
| 2013/0297978 A1 | 11/2013 | Jalbert et al. | |
| 2013/0326283 A1 | 12/2013 | Lippett et al. | |
| 2015/0212151 A1* | 7/2015 | Picalausa | G01B 31/31854 714/727 |

FOREIGN PATENT DOCUMENTS

| | | |
|---|---|---|
| WO | 2006030195 A2 | 3/2006 |
| WO | 2006079962 A2 | 8/2006 |
| WO | 2007084925 A2 | 7/2007 |
| WO | 2012087894 A2 | 6/2012 |

OTHER PUBLICATIONS

Asaad et al., "A Cycle-accurate, Cycle-reproducible multi-FPGA System for Accelerating Multi-core Processor Simulation", FPGA'12, Feb. 22-24, 2012, Copyright 2012 ACM, pp. 153-161.

De Paula et al., "TAB-BackSpace: Unlimited-Length Trace Buffers with Zero Additional On-Chip Overhead", DAC 2011, Jun. 5-10, 2011, Copyright 2011 ACM, 23.1, pp. 411-416.

Gort et al., "Formal-Analysis-Based Trace Computation for Post-Silicon Debug", IEEE Transactions on Very Large Scale Integration (VLSI) Systems, vol. 20, No. 11, Nov. 2012, pp. 1997-2010.

Nahir et al., "Post-Silicon Validation of the IBM POWER8 Processor", 2014 51st ACM/EDAC/IEEE Design Automation Conference (DAC), Jun. 1-5, 2014, 6 pages.

Riley et al., "Cell Broadband Engine Debugging for Unknown Events", IEEE Design & Test of Computers 24(5), pp. 486-493, Oct. 8, 2007, Copyright 2007 IEEE.

Riley et al., "Debug of the CELL Processor: Moving the Lab into Silicon", Paper 26.1, International Test Conference, 9 pages, Oct. 2006, Copyright 2006 IEEE.

Storm, "Random Test Generators for Microprocessor Design Validation", Sun Microsystems Inc., May 12, 2006, 10 pages, 8th EMICRO, <http://www.inf.ufrgs.br/emicro>.

Viennot et al., "Transparent Mutable Replay for Multicore Debugging and Patch Validation", ASPLOS'13, Mar. 16-20, 2013, Copyright 2013 ACM, pp. 127-138.

List of IBM Patents or Patent Applications Treated as Related (Appendix P), filed herewith.

U.S. Appl. No. 15/247,014, filed Aug. 25, 2016.
U.S. Appl. No. 14/753,324, filed Jun. 29, 2015.

* cited by examiner

EFFICIENCY OF CYCLE-REPRODUCIBLE DEBUG PROCESSES IN A MULTI-CORE ENVIRONMENT

BACKGROUND OF THE INVENTION

The present invention relates generally to post-silicon validation processes, and more particularly to improving efficiency of cycle-reproducible debug processes in a multi-core environment.

A post-silicon validation process can comprise four interleaved elements: stimulating a design under test (DUT), detecting erroneous behavior within the DUT, localizing a root cause of the erroneous behavior, and providing a fix.

The first two elements of the post-silicon validation process, i.e., stimuli generation and error detection, may be addressed through the use of bare-metal hardware exercisers, sometimes called software-based self-testing. Exercisers may be programs that run on a DUT, where the exercisers generate one or more test cases, execute the one or more test cases, and evaluate results from one or more test cases.

A debugging fail may be used to determine the root cause of an error by repeatedly executing a fail test in a cycle-reproducible environment to collect cycle-by-cycle latch data to create a multi-cycle trace of a chiplet's various latch states. This debug method relies on a design's reproducibility behavior within chiplet bounds and functions that enable executing the design for a given number of cycles. Typically, gathering a multi-cycle trace from the cycle-reproducible environment is performed using a single core.

SUMMARY

Aspects of an embodiment of the present invention disclose a method, a computer system, and a computer program product for cycle-reproducible debug processes in a multi-core environment, in accordance with an embodiment of the present invention. The computer system includes program instructions to execute an exerciser image on one or more cores, wherein the exerciser image includes one or more different seeds, wherein executing includes presetting each of the one or more cores with the one or more different seeds, wherein the one or more different seeds are at least one of: a pseudo random value or a binary value, and evaluating the one or more different seeds for each of the one or more cores concurrently. The computer system includes program instructions to determine a seed from the one or more different seeds that locates a fail-condition; responsive to determining a seed from the one or more different seeds that locates the fail condition, program instructions to determine an upper bound and a lower bound of the fail-condition, wherein determining includes executing the exerciser image with the seed on each of the one or more cores for a range of cycles, wherein each of the one or more cores is set to stop at a different cycle within the range of cycles, searching from an initial cycle at the beginning of a test execution run where the fail-condition does not exist to a subsequent cycle of a test execution run where the fail-condition exists, and determining whether the fail-condition has occurred within the range of cycles executed on each of the one or more cores. Responsive to a determination that the fail-condition has occurred within the range of cycles executed by at least one of the one or more cores, the computer system includes program instructions to determine a lowest cycle count in the at least one of the one or more cores where the fail-condition is an upper bound; responsive to a determination that the fail-condition has not occurred within the range of cycles executed by at least one of the one or more cores, program instructions to reset each of the one or more cores with a higher stopping cycle; program instructions to determine an exact cycle where the fail-condition occurs, wherein determining includes performing a plurality of distributed searches for the fail-condition across each of the one or more cores, wherein performing the plurality of distributed searches includes distributing a number of cycles between the upper bound and the lower bound across each of the one or more cores. The computer system includes program instructions to construct a multi-cycle trace for the fail-condition, wherein constructing includes performing one test execution per-cycle, including the exact cycle where the fail condition occurred, and extracting data from one or more cycles preceding the exact cycle where the fail-condition occurred, data from the exact cycle where the fail-condition occurred, and data from one or more cycles subsequent to the exact cycle where the fail-condition occurred. The computer system includes program instructions to aggregate test data collected from a plurality of test executions.

DETAILED DESCRIPTION

Embodiments of the present invention provide the capability to improve the efficiency of debug processes in a cycle-reproducible environment by leveraging the existence of multiple cores on a chip, such that processes are sped up c times, where c is a value indicating a number of cores utilized. Embodiments of the present invention provide the capability to divide work between multiple existing cores in a system to speed up a search to a good seed for improved efficiency of cycle-reproducible debug processes in a multi-core environment. Embodiments of the present invention provide the capability to improve efficiency of cycle-reproducible debug processes by reducing the time required to collect data for multi-cycle traces, thereby enabling faster end-to-end processes in the cycle-reproducible debug workflow.

Implementation of such embodiments may take a variety of forms, and exemplary implementation details are discussed subsequently with reference to the Figures.

Figure 1:
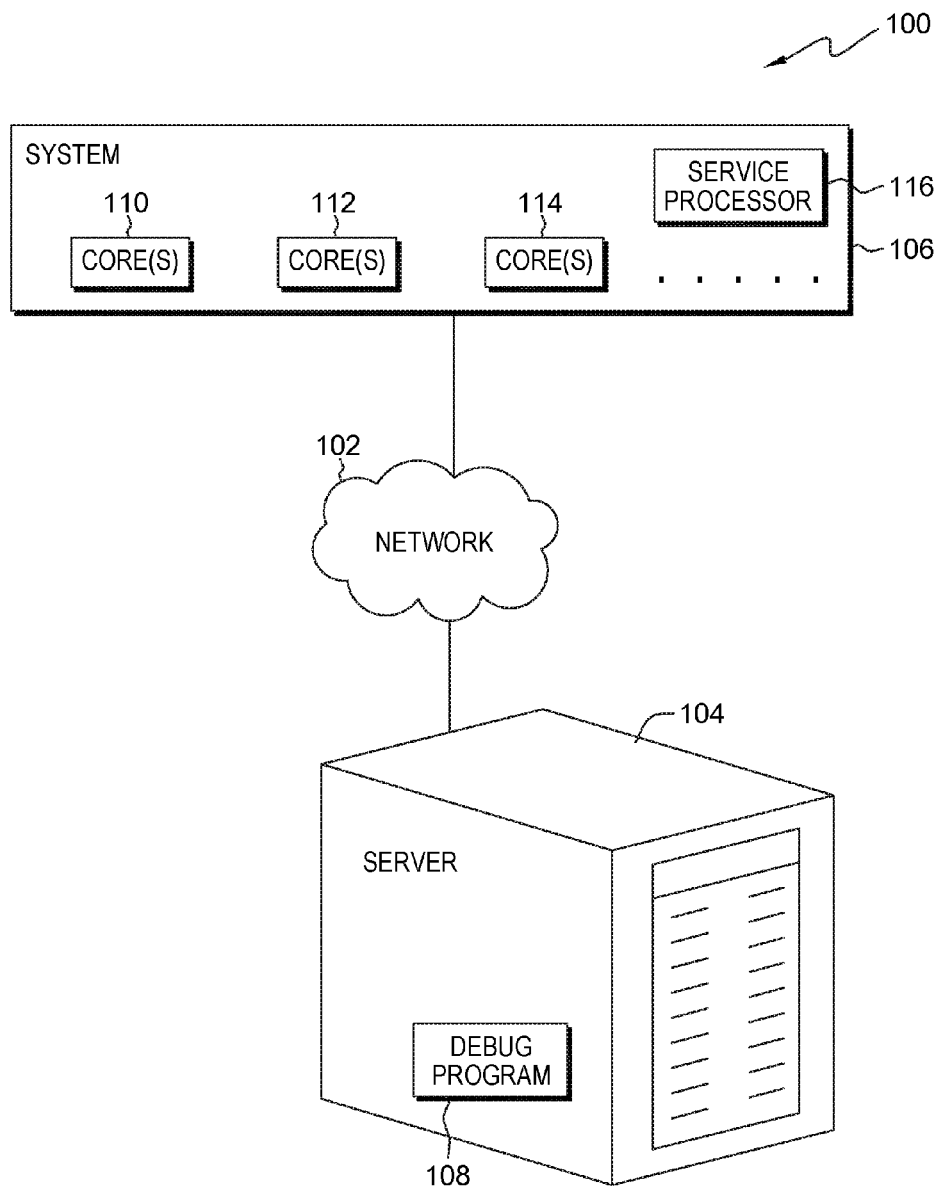
FIG. 1 is a functional block diagram illustrating a data processing environment in accordance with an embodiment of the present invention.

The present invention will now be described in detail with reference to the Figures. FIG. 1 is a functional block diagram illustrating a data processing environment, generally designated 100, in accordance with an embodiment of the present invention. FIG. 1 provides only an illustration of one implementation and does not imply any limitations with regard to the environments in which different embodiments may be implemented. Many modifications to the depicted environment may be made by those skilled in the art without departing from the scope of the invention as recited by the claims. FIG. 1 includes network 102, server 104, and system 106.

In one embodiment, network 102 is the Internet representing a worldwide collection of networks and gateways that use TCP/IP protocols to communicate with one another. Network 102 may include wire cables, wireless communication links, fiber optic cables, routers, switches and/or firewalls. Server 104 and system 106 are interconnected by network 102. Network 102 can be any combination of connections and protocols capable of supporting communications between server 104, system 106, debug program 108, and service processor 116. Network 102 may also be implemented as a number of different types of networks, such as an intranet, a local area network (LAN), a virtual local area network (VLAN), or a wide area network (WAN). FIG. 1 is intended as an example and not as an architectural limitation for the different embodiments.

In one embodiment, server 104 may be, for example, a server computer system such as a management server, a web server, or any other electronic device or computing system capable of sending and receiving data. In another embodiment, server 104 may be a data center, consisting of a collection of networks and servers providing an IT service, such as virtual servers and applications deployed on virtual servers, to an external party. In another embodiment, server 104 represents a "cloud" of computers interconnected by one or more networks, where server 104 is a computing system utilizing clustered computers and components to act as a single pool of seamless resources when accessed through network 102. This is a common implementation for data centers in addition to cloud computing applications. In one embodiment, server 104 includes debug program 108 for improving efficiency of a cycle reproducible debug in a multiple core system, such as system 106.

In one embodiment, debug program 108 operates on a central server, such as server 104, and can be utilized by one or more client machines, such as system 106, via network 102. In another embodiment, debug program 108 may be a software-based program downloaded from the central server, such as server 104, or a third-party provider (not shown), and executed on a client machine, such as system 106, to improve efficiency of cycle-reproducible debug processes in a multi-core environment. In another embodiment, debug program 108 may be a software-based program, downloaded from a central server, such as server 104, and installed on one or more client machines, such as system 106. In yet another embodiment, debug program 108 may be utilized as a software service provided by a third-party cloud service provider (not shown).

In one embodiment, debug program 108 is a software-based program for improving efficiency of cycle-reproducible debug processes in a multi-core environment. In one embodiment, debug program 108 provides the capability to improve efficiency of cycle-reproducible debug processes in a multi-core environment, such as the environment presented within system 106, by leveraging the existence of a plurality of cores, such as core(s) 110, 112, and 114. In one embodiment, debug program 108 provides the capability to speed up a search to a good seed and an upper bound by c times, where c is a number of core(s) in the multi-core environment.

In one embodiment, system 106 may be, for example, a server computer system such as a management server, a web server, or any other electronic device or computing system capable of sending and receiving data. In another embodiment, system 106 may be a data center, consisting of a collection of networks and servers providing an IT service, such as virtual servers and applications deployed on virtual servers, to an external party. In another embodiment, system 106 represents a "cloud" of computers interconnected by one or more networks, where system 106 is a computing system utilizing clustered computers and components to act as a single pool of seamless resources when accessed through network 102. This is a common implementation for data centers in addition to cloud computing applications. In one embodiment, system 106 is a data processing system including a plurality of processor cores, such as core(s) 110, core(s) 112, and core(s) 114 for processing data, and service processor 116.

In one embodiment, system 106 may be a client to server 104 and may be, for example, a desktop computer, a laptop computer, a tablet computer, a personal digital assistant (PDA), a smart phone, a thin client, or any other electronic device or computing system capable of communicating with server 104 through network 102. For example, system 106 may be a laptop computer capable of connecting to a network, such as network 102, to communicate with a central server to utilize a software-based program, such as debug program 108 of server 104, to improve efficiency of debug processes in a cycle-reproducible environment by leveraging the existence of one or more cores, such as core(s) 110, 112, and 114.

In one embodiment, service processor 116 provides the capability for debug program 108 of server 104 to communicate with a plurality of cores within a multi-core environment, such as core(s) 110, 112, and 114 in the multi-core environment presented within system 106.

Figure 2:
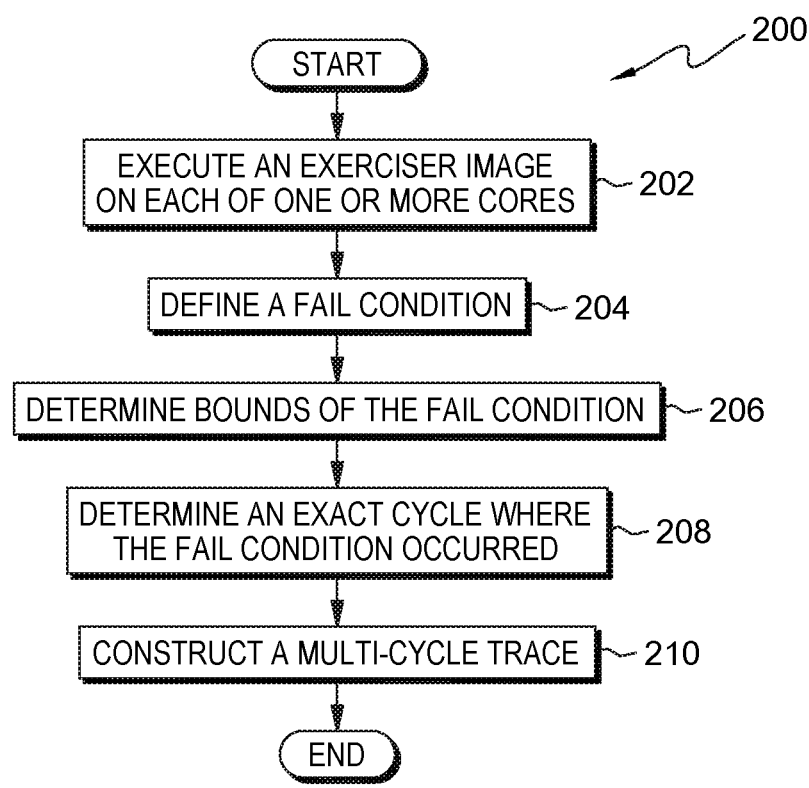
FIG. 2 is a functional block diagram illustrating the steps of a debug program, such as the debug program of FIG. 1, for cycle-reproducible debug processes in a multi-core environment, in accordance with an embodiment of the present invention.

FIG. 2 depicts a flowchart of the steps of a debug program, such as debug program 108 of FIG. 1, generally designated 200, for improving efficiency of debug processes in a cycle-reproducible environment, in accordance with an embodiment of the present invention.

Debug program 108 executes an exerciser image on each of one or more cores (202). In one embodiment, debug program 108 executes an exerciser image to find a seed (i.e., pseudo random value, binary value, etc.) that hits (i.e., generally locates) a fail-condition. In one embodiment, debug program 108 executes an exerciser image (i.e., the same exerciser image) on each of the one or more cores in a system, such as core(s) 110, 112, and 114 of system 106, wherein the exerciser image includes one or more different seeds. In one embodiment, debug program 108 presets each of the one or more cores with a different seed, such that debug program 108 evaluates c different seeds at the same time (i.e., concurrently), making the process c times faster, thereby c times more effective, where c is the number of cores in the system.

Debug program 108 defines a fail-condition (204). In one embodiment, debug program 108 defines a fail-condition (i.e., erroneous behavior) through, for example, an assertion of a fault isolation register (FIR) bit. Generally, a fail-condition occurs once within a given test execution.

Debug program 108 determines bounds of the fail condition (206). In one embodiment, debug program 108 determines bounds of the fail condition by searching from a lower-bound (i.e., a bound at the beginning of a test execution run where the fail-condition does not exist), for example zero, to an upper bound (i.e., a cycle where the fail-condition exists). In one embodiment, debug program 108 executes the same exerciser image with the same seed (i.e., the seed of step 202) on each of the one or more cores, such as core(s) 110, 112, and 114, setting each of the one or more cores to stop at a different cycle. In one embodiment, debug program 108 checks each of the one or more cores to determine whether the fail-condition has occurred within a range of cycles executed on each of the one or more cores. In one embodiment, responsive to a determination that the fail-condition has occurred in at least one of the one or more cores (i.e., at least one of the one or more cores has triggered the fail-condition), debug program 108 determines a lowest cycle count in the at least one of the one or more cores where the fail-condition exists, and determines the lowest cycle count as an initial upper bound. In one embodiment, responsive to a determination that the fail-condition has not occurred in at least one of the one or more cores, debug program 108 resets each of the one or more cores with a higher stopping cycle, thereby evaluating c different upper bound values as the same time, making the process c times more effective.

Debug program 108 determines an exact cycle where the fail-condition occurred (208). In one embodiment, debug program 108 determines an exact cycle where the fail-condition occurred by performing a distributed search for the fail-condition, where the search is distributed across each of the one or more cores of the system, such as core(s) 110, 112, and 114 of system 106. In one embodiment, debug program 108 distributes a number of cycles between the lower bound and the upper bound across each of the one or more cores, where the number of cycles can be a total number of cycles divided by c, a random number, a tester defined number, or a default number. For example, a system, such as system 106, having three cores, such as core(s) 110, 112, and 114, exhibits a fail-condition. The fail-condition does not occur within the first 1 million cycles, but does occur sometime before the first 2 million cycles. In this example, debug program 108 may assign core(s) 110 to execute 1.25 million cycles, core(s) 112 to execute 1.5 million cycles, and core(s) 114 to execute 1.75 million cycles. In one embodiment, debug program 108 performs a plurality of iterations of a plurality of distributed searches, where each of the plurality of iterations further reduces a search space (i.e., a total number/range of cycles between the lower bound and upper bound) by a factor of c plus one. For example, referring to the previous example, if the results of a first distributed search are at core(s) 110 the fail-condition does not occur, at core(s) 112 the fail-condition does not occur, and at core(2) 114 the fail-condition occurs, debug program 108 may execute a subsequent iteration, resetting a lower bound to 1.5 million cycles and an upper bound at 1.75 million cycles, such that core(s) 110 may execute 1.5 million cycles, core(s) 112 may execute 1.63 million cycles, and core(s) 114 may execute 1.75 million cycles. In one embodiment, debug program 108 continues to execute the plurality of iterations of a plurality of distributed searches until the exact cycle where the fail-condition occurs is determined. Generally, debug program 108 utilizes log(n) (base-c) iterations to locate the exact cycle where the fail-condition occurs, where n is the number of cycles required to hit the fail.

Debug program 108 constructs a multi-cycle trace (210). In one embodiment, debug program 108 constructs a multi-cycle trace by performing one execution per-cycle, extracting data for each cycle. In one embodiment, debug program 108 sets each of one or more cores in a system, such as core(s) 110, 112, and 114 of system 106, to stop on a different cycle. In one embodiment, debug program 108 extracts multi-cycles from a single system execution. For example, referring to the previous example, where a tester desired to collect data from the cycles preceding cycle 1.6 million, debug program 108 may execute a first test execution, assigning core(s) 110 to stop after 1,600,000 million, core(s) 112 to stop after 1,599,999 million cycles, and core(s) 114 to stop after 1,599,998 million cycles. In a second test execution, debug program 108 may assign core(s) 110 to stop after 1,599,997, core(s) 112 to stop after 1,599,996 million cycles, and core(s) 114 to stop after 1,599,995 million cycles, thereby collecting data on c cycles during each test execution. In one embodiment, debug program 108 aggregates test data collected from a plurality of text executions to create a multi-cycle trace. In one embodiment, the multi-cycle trace may include data from one or more cycles preceding an exact cycle where the fail-condition occurred, data from the exact cycle the fail-condition occurred, and data from one or more cycles subsequent to the exact cycle where the fail-condition occurred.

Figure 3:
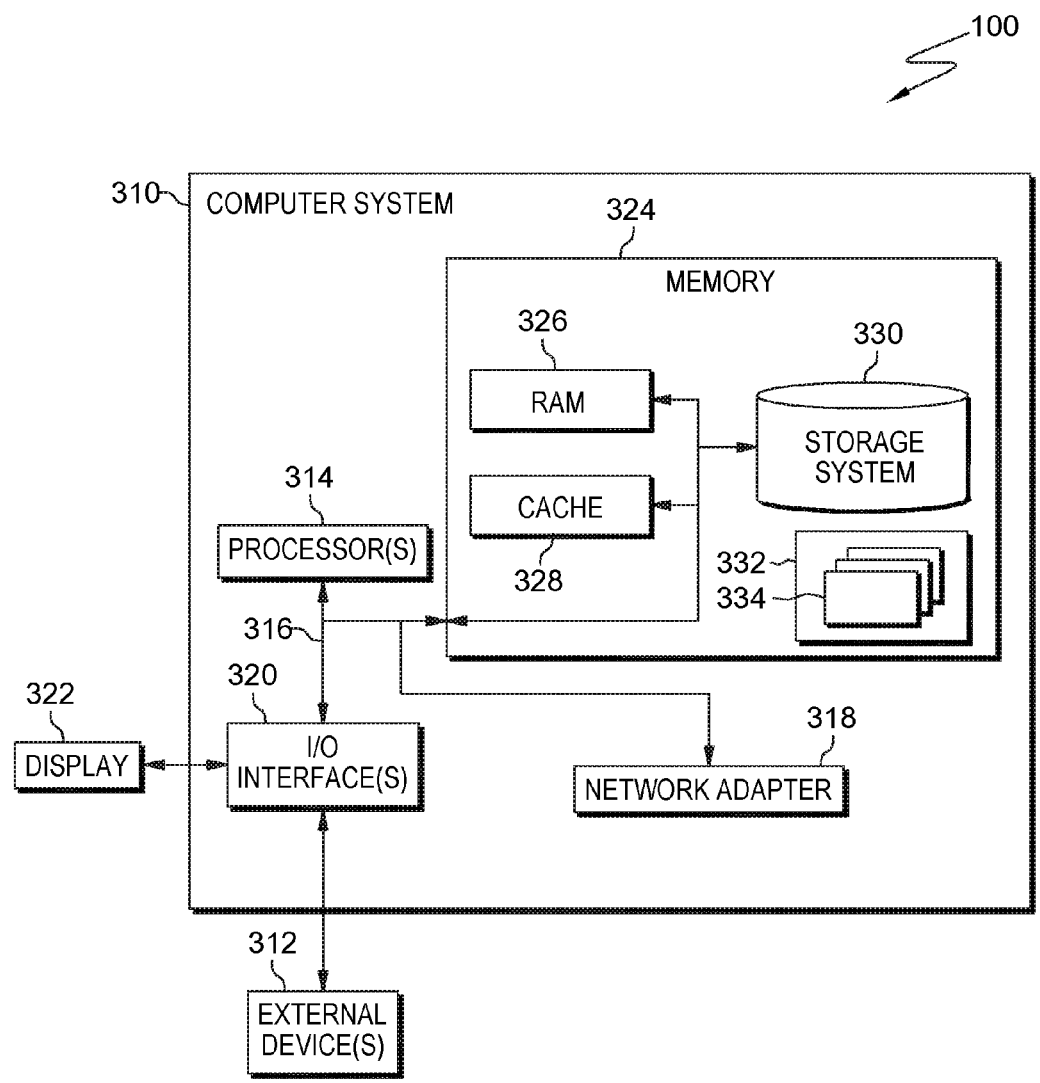
FIG. 3 is a block diagram depicting components of a data processing system (such as the server of FIG. 1), in accordance with an embodiment of the present invention.

FIG. 3 depicts a block diagram of components of data processing environment 100, such as server 104 of FIG. 1, in accordance with an illustrative embodiment of the present invention. It should be appreciated that FIG. 3 provides only an illustration of one implementation and does not imply any limitations with regard to the environments in that different embodiments may be implemented. Many modifications to the depicted environment may be made.

In the illustrative embodiment, server 104 in data processing environment 100 is shown in the form of a general-purpose computing device, such as computer system 310. The components of computer system 310 may include, but are not limited to, one or more processors or processing unit 314, memory 324, and bus 316 that couples various system components including memory 324 to processing unit(s) 314.

Bus 316 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnect (PCI) bus.

Computer system 310 typically includes a variety of computer system readable media. Such media may be any available media that is accessible by computer system 310, and it includes both volatile and non-volatile media, removable and non-removable media.

Memory 324 can include computer system readable media in the form of volatile memory, such as random access memory (RAM) 326 and/or cache memory 328. Computer system 310 may further include other removable/non-removable, volatile/non-volatile computer system storage media. By way of example only, storage system 330 can be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM, or other optical media can be provided. In such instances, each can be connected to bus 316 by one or more data media interfaces. As will be further depicted and described below, memory 324 may include at least one computer program product having a set (e.g., at least one) of program modules that are configured to carry out the functions of embodiments of the invention.

Program/utility 332, having one or more sets of program modules 334, may be stored in memory 324 by way of example, and not limitation, as well as an operating system, one or more application programs, other program modules, and program data. Each of the operating systems, one or more application programs, other program modules, and program data, or some combination thereof, may include an implementation of a networking environment. Program modules 334 generally carry out the functions and/or methodologies of embodiments of the invention as described herein. Computer system 310 may also communicate with one or more external device(s) 312 such as a keyboard, a pointing device, a display 322, etc., or one or more devices that enable a user to interact with computer system 310 and any devices (e.g., network card, modem, etc.) that enable computer system 310 to communicate with one or more other computing devices. Such communication can occur via Input/Output (I/O) interface(s) 320. Still yet, computer system 310 can communicate with one or more networks such as a local area network (LAN), a general wide area network (WAN), and/or a public network (e.g., the Internet) via network adapter 318. As depicted, network adapter 318 communicates with the other components of computer system 310 via bus 316. It should be understood that although not shown, other hardware and software components, such as microcode, device drivers, redundant processing units, external disk drive arrays, RAID (redundant array of independent disks) systems, tape drives, and data archival storage systems may be used in conjunction with computer system 310.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++, or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, a special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein.

The terminology used herein is for the purpose of describing particular embodiments only and is not intended to be limiting of the invention. It should be appreciated that any particular nomenclature herein is used merely for convenience and thus, the invention should not be limited to use solely in any specific function identified and/or implied by such nomenclature. Furthermore, as used herein, the singular forms of "a", "an", and "the" are intended to include the plural forms as well, unless the context clearly indicates otherwise.

What is claimed is:

1. A computer system for two stage log normalization, the computer system comprising:
   one or more computer processors;
   one or more computer readable storage devices; and
   program instructions stored on at least one of the one or more computer readable storage devices for execution by at least one of the one or more computer processors, the program instructions comprising:
   program instructions to execute an exerciser image on one or more cores, wherein the exerciser image includes one or more different seeds, wherein executing includes presetting each of the one or more cores with the one or more different seeds, wherein the one or more different seeds are at least one of: a pseudo random value or a binary value, and
   evaluating the one or more different seeds for each of the one or more cores concurrently;
   program instructions to determine a seed from the one or more different seeds that locates a fail-condition; responsive to determining a seed from the one or more different seeds that locates the fail condition, program instructions to determine an upper bound and a lower bound of the fail-condition, wherein determining includes executing the exerciser image with the seed on each of the one or more cores for a range of cycles, wherein each of the one or more cores is set to stop at a different cycle within the range of cycles, searching from an initial cycle at the beginning of a test execution run where the fail-condition does not exist to a subsequent cycle of a test execution run where the fail-condition exists, and determining whether the fail-condition has occurred within the range of cycles executed on each of the one or more cores;
   responsive to a determination that the fail-condition has occurred within the range of cycles executed by at least one of the one or more cores, program instructions to determine a lowest cycle count in the at least one of the one or more cores where the fail-condition is an upper bound; responsive to a determination that the fail-condition has not occurred within the range of cycles executed by at least one of the one or more cores, program instructions to reset each of the one or more cores with a higher stopping cycle; program instructions to determine an exact cycle where the fail-condition occurs, wherein determining includes performing a plurality of distributed searches for the fail-condition across each of the one or more cores, wherein performing the plurality of distributed searches includes distributing a number of cycles between the upper bound and the lower bound across each of the one or more cores;
   program instructions to construct a multi-cycle trace for the fail-condition, wherein constructing includes performing one test execution per-cycle, including the exact cycle where the fail condition occurred, and
   extracting data from one or more cycles preceding the exact cycle where the fail-condition occurred, data from the exact cycle where the fail-condition occurred, and data from one or more cycles subsequent to the exact cycle where the fail-condition occurred; and
   program instructions to aggregate test data collected from a plurality of test executions.

* * * * *